US012805164B2

(12) United States Patent
Cheng

(10) Patent No.: US 12,805,164 B2
(45) Date of Patent: Nov. 17, 2026

(54) MULTIPLE DISTRIBUTED BRAGG REFLECTOR PIXEL ARRAY

(71) Applicant: Avalon Holographics Inc., St. John's (CA)

(72) Inventor: Jiaqi Cheng, St. John's (CA)

(*) Notice: Subject to any disclaimer, the term of this patent is extended or adjusted under 35 U.S.C. 154(b) by 656 days.

(21) Appl. No.: 18/296,458

(22) Filed: Apr. 6, 2023

(65) Prior Publication Data

US 2024/0341157 A1 Oct. 10, 2024

(51) Int. Cl.

| | |
|---|---|
| ***H10K 59/80*** | (2023.01) |
| ***H10K 50/852*** | (2023.01) |
| ***H10K 50/856*** | (2023.01) |
| ***H10K 59/12*** | (2023.01) |
| ***H10K 59/38*** | (2023.01) |
| ***H10K 59/95*** | (2026.01) |
| ***H10K 102/10*** | (2023.01) |
| ***H10K 102/20*** | (2023.01) |

(52) U.S. Cl.

CPC ......... *H10K 59/876* (2023.02); *H10K 50/852* (2023.02); *H10K 50/856* (2023.02); *H10K 59/38* (2023.02); *H10K 59/875* (2023.02); *H10K 59/878* (2023.02); *H10K 59/8791* (2023.02); *H10K 59/95* (2023.02); *H10K 59/12* (2023.02); *H10K 2102/101* (2023.02); *H10K 2102/20* (2023.02)

(58) Field of Classification Search

CPC .. H10K 50/852; H10K 59/876; H10K 59/878; H10K 50/856; H10K 59/875; H10K 59/8791

See application file for complete search history.

(56) References Cited

U.S. PATENT DOCUMENTS

| | | | | |
|---|---|---|---|---|
| 2009/0059404 | A1* | 3/2009 | Wang | H10K 30/57 359/850 |
| 2011/0127549 | A1 | 6/2011 | Lee et al. | |
| 2020/0035937 | A1* | 1/2020 | Wu | H10K 50/11 |
| 2020/0251604 | A1 | 8/2020 | McGlynn et al. | |
| 2022/0013750 | A1* | 1/2022 | Cheng | H01S 5/04256 |
| 2022/0246673 | A1 | 8/2022 | Suh et al. | |
| 2023/0019355 | A1 | 1/2023 | Cheng et al. | |

FOREIGN PATENT DOCUMENTS

| | | |
|---|---|---|
| WO | 2016015746 | 2/2016 |

* cited by examiner

*Primary Examiner* — Aaron J Gray

(57) ABSTRACT

A microcavity pixel array device and fabrication method having a shared multi-DBR system configured to cover a wide spectral bandwidth range. A wide emission waveband is achieved by depositing a first DBR on top of an OLED array and subsequently depositing a second DBR on top of the first DBR, with each DBR having a unique design. The multi-DBR covers a wider spectral bandwidth range than a single DBR, therefore achieving nearly total reflection for a range of OLEDs designed at different color wavelengths.

17 Claims, 10 Drawing Sheets

MULTIPLE DISTRIBUTED BRAGG REFLECTOR PIXEL ARRAY

FIELD OF THE INVENTION

The present invention pertains to microcavity pixel devices, and more particularly, organic light emitting diode (OLED) microcavity design and fabrication processes for a high angular resolution, wide field of view, multiple view display with multiple distributed Bragg reflectors (DBRs).

BACKGROUND

Light field displays provide multiple views, allowing a user to receive a separate view in each eye. This enables the viewer to experience a three-dimensional view of a scene without the requirement for external hardware such as stereoscopic glasses or a headset. While current light field displays in this category can provide an interesting viewing experience, a captivating light field display requires a very high pixel density, very low angular separation between views, and a large viewing angle. It is further desirable that a user experiences smooth transitions between viewing zones while maintaining an independent and perceivable view from the adjacent views. One fundamental requirement in achieving these viewing parameters is controlling the output characteristics of the emission source. Organic light-emitting diodes (OLEDs) bound in a microcavity allow control of the spectral bandwidth and output angle of the resulting light.

Organic light-emitting diodes (OLEDs) consist of thin-film layers of organic material coated on a substrate, which is generally made of glass, between two electrodes. OLEDs have a characteristically broad spectral width and Lambertian intensity distribution profile. The thin-film layers disposed between the anode and cathode commonly include one or more of an Organic Hole-Injection Layer (HIL), an Organic Hole-Transporting Layer (HTL), an Emissive Layer (EML), an Organic Electron-Transporting Layer (ETL), and an Organic Electron-Injection Layer. Light is generated in an OLED device when electrons and holes that are injected from the cathode and the anode (electrodes), respectively, flow through the ETL and the HTL and recombine in the EML.

One method for controlling the output characteristics of light is using a microcavity. Microcavity OLED devices have enhanced performance and color purity due to their narrow-band emission. A microcavity can be formed between two mirrors. In one example of a microcavity OLED the first mirror can be a metal cathode and the second mirror can be a layered stack of non-absorbing materials. One type of layered stack of non-absorbing materials is a distributed Bragg reflector (DBR), which is a photonic structure often used as a dielectric mirror composed of multiple pairs of two different dielectric layers with different refractive indices in an alternating order. The highest reflectivity of a DBR is attained when the layer thicknesses are selected such that the optical path length of each layer is one quarter of the resonance wavelength of the microcavity, commonly referred to as the Bragg Wavelength $\lambda_{Bragg}$. Certain wavelengths of light are reflected between the two mirrors, within the microcavity, adding in phase until the resonance wavelength is achieved. The resulting resonant wavelengths will have an increased intensity, while the intensity of other wavelengths within the microcavity will be reduced, thereby reducing the spectral bandwidth of emission of the microcavity device.

Two main design variables affecting the output characteristics of a microcavity are the reflectance of the top and bottom surfaces, which serve as opposing mirrors, and the optical path length, where the optical path length between the opposing mirrors is a multiple of the wavelength. The wavelength of the light output by such a resonant OLED structure is dependent, in part, upon this optical path length of the microcavity. The optical path length in the cavity can be manipulated in different ways, one of which is by changing the thickness of the layers that make up the microcavity. Adjusting the optical path length of a single microcavity adjusts the emission color. For a multi-colored MCOLED array, adjustment of the cavity layer thicknesses can also tune the emission color. A DBR shared across multiple microcavity devices can also be used to tune the optical path length of each microcavity, however shared a DBR structure deposited over microcavity devices for different emission colors are limited to the stopband of the single DBR. The stopband often neglects lower and/or upper wavelengths emitted by different color pixels, thereby only emitting controlled light beams for a reduced color spectrum of light. Additionally, at the upper and lower wavelengths of the DBR stopband the reflectance efficiency trails downward. For subpixels with a peak emission wavelength offset from the Bragg wavelength of the DBR, such as those in the blue and red regions, the result is reduced optical resonance.

US Patent Application publication number US2022/0246673 to Suh et al. describes a display module having a substrate and a plurality of pixels provided on the substrate, where each of the plurality of pixels has a first inorganic light emitting element including a distributed Bragg reflector (DBR) layer, a second inorganic light emitting element including a DBR layer, a third inorganic light emitting element, a first color conversion layer provided adjacent to the first inorganic light emitting element, a second color conversion layer provided adjacent to the second inorganic light emitting element, and a first color filter provided adjacent to the first color conversion layer. A second color filter is provided adjacent to the first color conversion layer, and a second color filter is provided adjacent to the second color conversion layer, wherein a size of the first color conversion layer is larger than a size of the first inorganic light emitting element, and a size of the second color conversion layer is larger than a size of the second inorganic light emitting element.

This background information is provided for the purpose of making known information believed by the applicant to be of possible relevance to the present invention. No admission is necessarily intended, nor should be construed, that any of the preceding information constitutes prior art against the present invention.

SUMMARY OF THE INVENTION

An object of the present invention is to provide a device and method to increase the emission spectrum bandwidth of a distributed Bragg reflector (DBR) when used in a microcavity OLED display. This can be achieved by the use of multiple stacked DBRs, stacked on top of one another in a multi-DBR structure, wherein each DBR in the structure has a different Bragg wavelength to expand the spectral bandwidth of reflectance of the total multi-DBR structure. The multiple stacked DBR layers facilitate fabrication of the MCOLED array while providing extensive spectral emissive bandwidth.

In an aspect there is provided a microcavity Organic Light Emitting Diode (MCOLED) array device comprising: a substrate; a plurality of subpixels deposits above the substrate, the subpixels having at least two different colors, each subpixel comprising: a bottom electrode; an organic stack deposited above the bottom electrode; and a top electrode deposited above the organic stack; and a shared multi-DBR system deposited on the plurality of subpixels, the multi-DBR system comprising: a first distributed Bragg reflector (DBR) having a first Bragg wavelength; and a second distributed Bragg reflector (DBR) above the first DBR, the second DBR having a second Bragg wavelength different from the first Bragg wavelength.

In an embodiment, the first DBR has a first stopband, the second DBR has a second stopband, and the first stopband and second stopband overlap.

In another embodiment, the shared multi-DBR system has a multi-DBR stopband which is the sum of the first stopband and the second stopband.

In another embodiment, the first DBR and the second DBR are comprised layers of one or more of silicon nitride ($Si_3N_4$), silicon dioxide ($SiO_2$), zinc sulfide (ZnS), calcium fluoride ($CaF_2$), aluminum oxides ($AlO_x$), magnesium fluoride ($MgF_2$), lithium fluoride (LiF), tellurium oxides ($TeO_x$), and titanium dioxide ($TiO_2$).

In another embodiment, the first DBR and the second DBR comprise sublayers of alternating high refractive index dielectric material and low refractive index dielectric material, and each sublayer provides an optical path length equal to one quarter of the Bragg wavelength for the DBR.

In another embodiment, the sublayers of alternating high refractive index dielectric material and low refractive index dielectric material have different indices of refraction.

In another embodiment, the sublayers of alternating high refractive index dielectric material and low refractive index dielectric material the first DBR and the second DBR are of different thicknesses.

In another embodiment, the sublayers of alternating high refractive index dielectric material and low refractive index dielectric material for each of the first DBR and the second DBR are of one or more of different materials and different thicknesses.

In another embodiment, the subpixel colors are red, green, or blue.

In another embodiment, the bottom electrode of each subpixel comprises a reflective metal or reflective metal alloy.

In another embodiment, the bottom electrode comprises one or more layers of silver (Ag), aluminum (Al), gold (Au), Ag/Al, Lithium (Li)/Al, or Calcium (Ca)/Ag.

In another embodiment, the substrate is transparent.

In another embodiment, a bottom DBR structure is deposited above the bottom electrode and below the organic stack. In another embodiment, a bottom DBR structure is deposited below the organic stack.

In another embodiment, the top electrode comprises one or more of a metal reflective surface and a semi-transparent conductive material.

In another embodiment, the top electrode is transparent.

In another embodiment, the shared multi-DBR system comprises two or more distributed Bragg reflectors.

In another aspect there is provided a microcavity Organic Light Emitting Diode (MCOLED) array device comprising: a substrate; a subpixel array deposited above the substrate, each subpixel in the subpixel array comprising: a bottom electrode; an optical filler layer deposited above the bottom electrode for a specific color; a white organic stack deposited above the optical filler layer; and a top electrode deposited above the white organic stack; and a multi-DBR system deposited above the subpixel array comprising: a first distributed Bragg reflector (DBR) having a first Bragg wavelength; and a second distributed Bragg reflector (DBR) above the first DBR, the second DBR having a second Bragg wavelength different from the first Bragg wavelength.

In an embodiment, the white organic stack is deposited as a blanket deposition above the subpixel array.

In another embodiment, the optical filler layer in each subpixel has a thickness selected to emit the specific color of light.

In another embodiment, the optical filler layer for each specific color of subpixel is one or more of a different thickness and a different material.

In another aspect there is provided a method for fabricating a microcavity Organic Light Emitting Diode (MCOLED) array comprising: depositing a first colored subpixel on a substrate comprising: depositing a first color bottom electrode; depositing a first color organic stack on the first color bottom electrode; and depositing a first top electrode on the first color organic stack; depositing a second colored subpixel on the substrate comprising: depositing a second bottom electrode on the substrate; depositing a second color organic stack on the second bottom electrode; and depositing a second top electrode on the second color organic stack; and depositing a multi-DBR system over the first colored subpixel and the second colored subpixel, the multi-DBR system comprising: a first distributed Bragg reflector (DBR) having a first Bragg wavelength; and a second distributed Bragg reflector deposited above the first DBR having a second Bragg wavelength different from the first Bragg wavelength.

In an embodiment the method further comprises depositing a pixel definition layer above the first and second bottom electrodes.

In another embodiment, the bottom electrodes are deposited using one of a physical vapor deposition (PVD), sputtering, or chemical vapor deposition (CVD) technique.

In another aspect there is provided a method for fabricating a microcavity Organic Light Emitting Diode (MCOLED) array comprising: patterning a substrate to deposit a plurality of subpixels comprising: depositing a bottom electrode; and depositing an optical filler layer above the bottom electrode for a specific color; depositing a white organic stack on the plurality of subpixels; depositing a top electrode above the white organic stack; and depositing a multi-DBR system above the top electrode, the multi-DBR system comprising: a first distributed Bragg reflector (DBR) having a first Bragg wavelength; and a second distributed Bragg reflector (DBR) above the first DBR, the second DBR having a second Bragg wavelength different from the first Bragg wavelength.

In an embodiment, the white organic stack is blanket deposited above the plurality of subpixels.

In another embodiment, the top electrode is blanket deposited above the white organic stack.

Embodiments of the present invention as recited herein may be combined in any combination or permutation.

BRIEF DESCRIPTION OF THE FIGURES

For a better understanding of the present invention, as well as other aspects and further features thereof, reference is made to the following description which is to be used in conjunction with the accompanying drawings, where.

DETAILED DESCRIPTION OF THE INVENTION

Figure 1:
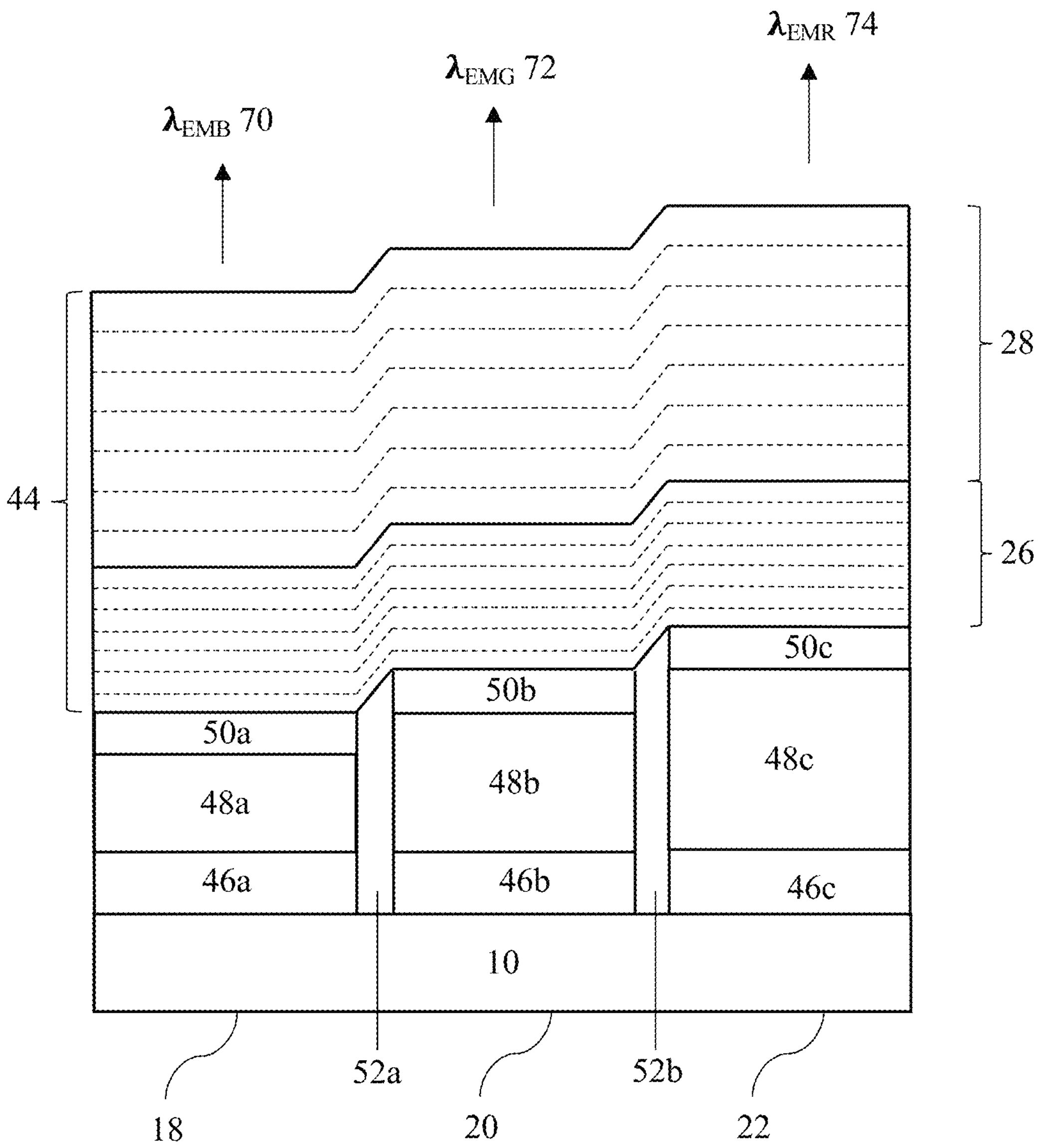
FIG. 1 illustrates a cross-section of a multi-color MCOLED with multiple stacked DBR structures.

Unless defined otherwise, all technical and scientific terms used herein have the same meaning as commonly understood by one of ordinary skill in the art to which this invention belongs.

As used in the specification and claims, the singular forms "a", "an" and "the" include plural references unless the context clearly dictates otherwise.

The term "comprise" and any of its derivatives (e.g. comprises, comprising) as used in this specification is to be taken to be inclusive of features to which it refers, and is not meant to exclude the presence of any additional features unless otherwise stated or implied. The term "comprising" as used herein will also be understood to mean that the list following is non-exhaustive and may or may not include any other additional suitable items, for example one or more further feature(s), component(s) and/or element(s) as appropriate.

As used herein, the terms "having," "including" and "containing," and grammatical variations thereof, are inclusive or open-ended and do not exclude additional, unrecited elements and/or method steps, and that that the list following is non-exhaustive and may or may not include any other additional suitable items, for example one or more further feature(s), component(s) and/or element(s) as appropriate. A composition, device, article, system, use, process, or method described herein as comprising certain elements and/or steps may also, in certain embodiments consist essentially of those elements and/or steps, and in other embodiments consist of those elements and/or steps and additional elements and/or steps, whether or not these embodiments are specifically referred to.

As used herein, the term "about" refers to an approximately +/−10% variation from a given value. It is to be understood that such a variation is always included in any given value provided herein, whether or not it is specifically referred to. The recitation of ranges herein is intended to convey both the ranges and individual values falling within the ranges, to the same place value as the numerals used to denote the range, unless otherwise indicated herein.

The use of any examples or exemplary language, e.g. "such as", "exemplary embodiment", "illustrative embodiment" and "for example" is intended to illustrate or denote aspects, embodiments, variations, elements or features relating to the invention and not intended to limit the scope of the invention.

As used herein, the terms "connect" and "connected" refer to any direct or indirect physical association between elements or features of the present disclosure. Accordingly, these terms may be understood to denote elements or features that are partly or completely contained within one another, attached, coupled, disposed on, joined together, in communication with, operatively associated with, etc., even if there are other elements or features intervening between the elements or features described as being connected.

Unless defined otherwise, all technical and scientific terms used herein have the same meaning as commonly understood by one of ordinary skill in the art to which this invention pertains.

As used herein, the term "DBR" refers to a distributed Bragg reflector. A distributed Bragg reflector (DBR) is a photonic device, often used as an optical mirror, composed of multiple pairs of alternating layers of two dielectric materials with different refractive indices, each layer having a $\lambda/4$ thickness, where $\lambda$ is the central wavelength of operation.

As used herein, the term "transparent" refers to a material which allows visible light to pass through it.

As used herein, the term "transparent conductive oxide" or TCO refers to a doped metal oxide commonly used in optoelectronic devices. TCO materials include but are not limited to Indium Tin Oxide (ITO), Fluorine-doped Tin Oxide (FTO), Aluminum-doped Zinc Oxide (AZO), Indium-doped Zinc Oxide (IZO), and Gallium-doped Zinc Oxide (ZnO).

As used herein, the term "pixel" refers to a light source and light emission mechanism used to create a display.

As used herein, the term "vertical-cavity surface-emitting laser (VCSEL)" refers to a semiconductor-based laser diode that emits light or optical beam vertically from its top surface.

As used herein, the term "electron-hole balancing" refers to the charge balance within an organic light emitting diode device. Electrons and holes injected from the respective contacts recombine in an emission zone to form excitons which undergo radiative emission to generate light. The external device efficiency is determined by the fraction of light, which is generated in the device stack and extracted to air. In an OLED device, the internal device efficiency is highly dependent on the charge balance of the device.

As used herein, the term "subpixel" refers to a structure comprised of a light emitting device housed within an optical microcavity. The optical microcavity is operatively associated with a plurality of reflective surfaces to substantially collimate, manipulate, or tune the light. At least one of the reflective surfaces is a light propagating reflective surface connected to the optical microcavity to propagate the light out of the microcavity. The present disclosure provides individually addressable red, green, and blue (RGB) pixels.

The subpixel size as presently described is in a nanoscale to several microns range, which is significantly smaller than the pixel size previously known in the art.

As used herein, the acronym "FWHM" refers to 'full width half maximum', which is an expression of the extent of a function given by the difference between the two extreme values of the independent variable at which the dependent variable is equal to half of its maximum value.

As used herein, the term "OLED" refers to an Organic Light Emitting Diode, which is an opto-electronic device which emits light under the application of an external voltage. OLEDS can be divided into two main classes: those made with small organic molecules and those made with organic polymers. An OLED is a light-emitting diode in which the emissive electroluminescent layer comprises a film of organic compound that emits light in response to an electric current. Generally, an OLED is a solid-state semiconductor device comprised at least one conducting organic layer disposed between and electrically connected to an anode and a cathode. When a current is applied, the anode injects holes and the cathode injects electrons into the organic layers. The injected holes and electrons each migrate toward the oppositely charged electrode. When an electron and hole localize on the same molecule, an exciton, which is a localized electron-hole pair having an excited energy state, is formed. Light is emitted when the exciton relaxes via a photoemissive mechanism. Types of OLEDs include, but are not limited to:

a. Active-matrix OLEDs (AMOLED)

AMOLEDs have full layers of cathode, organic molecules and anode. The anode layers have a thin film transistor (TFT) plane in parallel to it to form a matrix. This helps in switching each pixel to its on or off state as desired, thus forming an image. Hence, the pixels switch off whenever they are not required or there is a black image on the display, increasing the battery life of the device. This is the least power consuming type of OLED and has quicker refresh rates which makes them suitable for video. The best uses for AMOLEDs are computer monitors, large-screen TVs and electronic signs or billboards.

b. Top-emitting OLEDs

Top-emitting OLEDs have a substrate that is either opaque or reflective. Top-emitting OLEDs are better suited for active-matrix applications as they can be more easily integrated with a non-transparent transistor backplane. Manufacturers use top-emitting OLED displays in smart cards.

c. Bottom-emitting OLEDs

An OLED is bottom emitting if the emitted light passes through the transparent or semi-transparent bottom electrode and substrate.

As used herein, the term "microcavity" refers to a structure formed by reflecting faces on the two sides of a spacer layer or optical medium, such as, for example, an OLED.

As used herein, the term "microcavity OLED" (MCOLED) refers to the materials of an OLED, as previously described, bound in a microcavity defined by two reflective surfaces, in which the reflective surfaces can be metallic materials, dielectric materials arranged in such a way to reflect light within a specific range, or a combination of dielectric and metallic materials.

As used herein, the term "electrode" refers to a conductor through which electricity enters or leaves an object, substance, or region.

As used herein, the term "cathode" refers to the negatively charged electrode by which electrons enter an electrical device.

As used herein, the term "anode" refers to the positively charged electrode by which the electrons leave an electrical device.

As used herein, the term "patterning" refers to a technique using a series of post treatments to chemically engrave a transferred pattern into or allow the deposition of new material in the transferred pattern upon a target material.

As used herein, the term "blanket deposition" refers to depositing material without using a patterning technique.

As used herein, the term "mirror" refers to an object that reflects light in such a way that, for incident light in some range of wavelengths, the reflected light preserves many or most of the detailed physical characteristics of the original light, called specular reflection. Two or more mirrors aligned exactly parallel and facing each other can give an infinite regress of reflections, called an infinity mirror effect.

As used herein, the term "optical path length", denoted by Λ, refers to the distance between two points (P1, P2), accounting for the refractive index (n) of the material that light travels through. In an example OLED device, the media that the light travels through may comprise one or more semitransparent or transparent intermediate electrodes and other layers, as well as layers comprising a white OLED stack. An optical path length is defined as the function:

$$\Lambda = \sum_{P1}^{P2} n_i d_i.$$

As used herein, the term "transmissivity" refers to the percentage of light transmitted per the incident light.

As used herein, the term "wavelength" is a measure of distance between two identical peaks (high points) or troughs (low points) in a wave, which is a repeating pattern of traveling energy such as light or sound.

It is contemplated that any embodiment of the compositions, devices, articles, methods and uses disclosed herein can be implemented by one skilled in the art, as is, or by making such variations or equivalents without departing from the scope of the invention.

An organic light emitting diode (OLED) structure typically includes a substrate, a first electrode, an OLED stack of organic material layers, and a second electrode. The organic materials stack may include a hole injection layer (HIL), a hole transport layer (HTL), an electron injection layer (EIL), an electron transport layer (ETL) and an emissive layer (EML). Material and thickness design considerations for the layers of the OLED stack of a MCOLED are based upon the desired indices of refraction n and electron-hole balancing requirements. A balanced charge injection results from the equal flow rate of electrons/holes to the emissive layer (EML). If an OLED device is unbalanced, the electrons or holes will accumulate and charge the emission layer, thereby compromising device output.

A microcavity organic light emitting diode (MCOLED) is a device in which the materials of an OLED are bound in a microcavity defined by two reflective surfaces arranged in such a way to reflect light within a specific range, or some combination of dielectric and metallic materials. The organic materials which make up the OLED stack are arranged with material thicknesses $d_j$ which have an optical path length of $L_j$, where $L_j = n_j \times d_j$, and where $n_j$ is the refractive index of the OLED material. The sum of the optical path length of the materials between the reflective surfaces is designed to equal $m\lambda_i/2$, where $\lambda_i$ is the peak design wavelength of the MCOLED. The optical path length can therefore be changed by changing the thickness of one or more of the materials between the reflective surfaces, or by adding one or more additional filler material (optical filler layer 56). The optical filler layer 56 is selected to emit a desired wavelength range of light from the MCOLED. The use of a microcavity in an OLED structure decreases the spectral width of the OLED, decreases the angular output, and increases the overall efficiency. Tuning of the optical microcavity for specific wavelengths of light, or color, is a challenging task as tuning a microcavity is achieved by creating a resonance at a specific wavelength between two reflective surfaces, completed by selecting and defining material thickness, refractive index, and phase change through careful analysis and simulations.

The reduced angular spread due to the microcavity can be approximated as:

$$\delta\theta_{FWHM} = \sqrt{\frac{2\lambda_i(1 - R_{Cathode}R_{DBR})}{\pi L_i^4\sqrt{R_{Cathode}R_{DBR}}}}$$

Similarly, the FWHM of the output spectrum is determined as:

$$\delta\lambda_{FWHM} = \sqrt{\frac{\lambda_i^2(1 - R_{Cathode}R_{DBR})}{2\pi L_i^4\sqrt{R_{Cathode}R_{DBR}}}}$$

where $R_{Cathode}$ is the reflectance of the cathode, and $R_{DBR}$ is the reflectance of the DBR.

The highest reflectivity of the DBR structure is attained when the layer thicknesses, $d_i$, are chosen such that the optical path length of each layer is one quarter of the resonance wavelength, or:

$$d_i = \frac{\lambda_{Bragg}}{4n}$$

where $\lambda_{Bragg}$ is the design wavelength for the DBR, which can be any value but is chosen such that the reflectance is high in the wavelength range for the design. Under these conditions, all reflections will add in phase, and the transmissivity will decrease exponentially as a function of mirror thickness.

The reflectance of a DBR at $\lambda_{Bragg}$ can be approximated as:

$$R_{DBR} = \left(\frac{1 - \left(\frac{n_1}{n_2}\right)^{2\Lambda}}{1 + \left(\frac{n_1}{n_2}\right)^{2\Lambda}}\right)^2$$

where $n_1$ is the refractive index of the low index DBR at $\lambda_{Bragg}$, $n_2$ is the refractive index of the high index DBR material at $\lambda_{Bragg}$, and $\Lambda$ is the number of dielectric pairs. At longer or shorter wavelengths, the reflections begin to add out of phase, therefore the total reflections decrease.

The result is a broad-band high-reflectivity region centered on $\lambda_{Bragg}$, referred to as the stop band, $\delta\lambda_{sb}$ determined as:

$$\delta\lambda_{sb} = 2\frac{\lambda_{Bragg}(n_2 - n_1)}{\pi n_{eff}}$$

where $n_{eff}$ is the effective index. These are the theoretical design variables considered for a microcavity OLED structure with a DBR. The materials of the DBR can be any material which are not opaque in the wavelength range of the design. For example, in the visible wavelength range, materials such as silicon nitride, titanium dioxide, silicon dioxide, and other dielectrics may be used.

The total optical path length of the microcavity is represented as:

$$L_i = L_{DBR} + L_{organics} + L_{Cathode}$$

where $L_{DBR}$ is the penetration depth into the DBR, $L_{Organics}$ is the optical path length in the OLED materials, and $L_{Cathode}$ is the penetration depth into the metal cathode.

The optical path length in the materials between the two reflective surfaces is found as the sum of the optical path lengths in each material:

$$L_{organics} = \sum_i^N n_i d_i$$

where $n_i$ and $d_i$ are the layer indices and thicknesses, respectively. The penetration depth into the DBR can be determined as:

$$L_{DBR} = \frac{\lambda_{Bragg}}{2}\frac{n_{eff}}{(n_2 - n_1)}$$

and the penetration depth into the metal cathode is:

$$L_{Cathode} = \left|\frac{\Phi_m}{4\pi}\lambda_i\right|$$

where $\Phi_m$ is the phase shift at the metal reflector, given by:

$$\Phi_m = \tan^{-1}\left(\frac{2n_{Cavity}k_{Cathode}}{n_{Cavity}^2 - n_{Cathode}^2 - k_{Cathode}^2}\right)$$

where $n_{Cavity}$ is the refractive index of the organic in contact with the cathode, and $n_{Cathode}$ and $k_{Cathode}$ are the real and imaginary parts of the refractive index of the metal cathode.

Herein is described a microcavity OLED array and method of making a microcavity OLED array with a shared DBR structure shared across a plurality of pixels and subpixels, where the shared DBR structure has multiple shared DBR structures. A single DBR structure is understood to comprise multiple alternating layers of two different dielectric materials, each with different refractive indices. Increasing the number of pairs in a DBR increases the mirror reflectivity and increasing the refractive index contrast between the materials in the Bragg pairs increases both the reflectivity and the bandwidth. As understood herein, a multiple DBR structure comprises at least two different and distinct DBR structures, where each of the different DBR structures has its own distinct alternating layer structure, layer width, and/or layer materials that is different from the DBRs in the multiple DBR structure, and where each of the different single DBR structures in the multiple DBR structure has a different Bragg wavelength, or $\lambda_{Bragg}$. By way of example, each of the DBR layers in the multiple DBR structure can vary by, for example, thickness of each of the alternating dielectric layers, material of the dielectric layers, microstructure of the dielectric layers, and/or method of deposition of the dielectric layers, where the property of the dielectric layers can confer structural and functional operational characteristics of the DBR layer that it is in. By using multiple stacked DBR structures on top of one another over an OLED microcavity array, with each of the multiple DBR or Bragg structures having a different Bragg wavelength, blanket fabrication techniques can be used in microcavity OLED array manufacture to deposit each of the layers providing a simplified method of layering with good optical performance. The present device and method using multiple stacked DBRs increases the visible spectrum coverage of the OLED array in a microcavity OLED display providing an extensive spectral emissive bandwidth range across a more fulsome range of visible wavelengths of light in the visible spectrum emitted by the colored subpixels in the OLED array.

Distributed Bragg reflectors (DBRs) are designed for a tight spectral bandwidth range and are therefore functional for a narrow color spectrum. Known MCOLED devices which use DBRs generally have a unique DBR structure, designed and selected based on the pixel of the MCOLED. This is particularly advantageous for an RGB display, specifically for a device with a DBR deposited on top of an organic stack. Microscale multi-color microcavity OLED arrays face numerous fabrication challenges, and techniques facilitating accurate and scalable material deposition, specifically blanket deposition, is desirable to provide a more economical and reproducible fabrication. Additionally, depositing the DBR using a blanket deposition method as opposed to photolithographic patterning methods prevents the underlying fragile organic layers from exposure to harmful developers used in photolithography.

FIG. 1 illustrates a cross section of a multi-color MCOLED array comprising a blue subpixel 18, green subpixel 20, and red subpixel 22, which emit a blue emission waveband $\lambda_{EMB}$ 70, green emission waveband $\lambda_{EMG}$ 72, and red emission waveband $\lambda_{EMR}$ 74, respectively. Each of the three individually colored subpixels (blue 18, green 20, and red 22) of the multi-colored OLED array are deposited on a substrate 10, with each subpixel deposited on top of an individual bottom electrode 46*a*, 46*b*, 46*c*. It is understood that each individual pixel 18, 20, 22 may comprise, but is not limited to, a bottom electrode (anode or cathode) such as bottom electrode 46*a*, 46*b*, 46*c*, an organic semiconductor layer 48*a*, 48*b*, 48*c* specific to the color of the subpixel, and a top electrode 50*a*, 50*b*, 50*c* which serves as a second electrode and the complementary anode or cathode to the bottom electrode. The organic semiconducting layer can comprise one or more of an Organic Hole-Injection Layer (HIL), an Organic Hole-Transporting Layer (HTL), an Emissive Layer (EML), an Organic Electron-Transporting Layer (ETL), and an Organic Electron-Injection Layer as needed for generation of the photons emitted from the pixel. An optional pixel definition layer (PDL) 52*a*, 52*b* can be deposited between the subpixels.

Individual subpixels 18, 20, 22 share a single first DBR 26 with alternating layers material having a low index of refraction, or low index layer, and high index of refraction, or high index layer. On top of the first DBR 26 is a second DBR 28, also comprises of layers of alternating high index layers and low index layers, however having a different layer thickness, or alternatively a different layer structure and/or composition, as the layers in the first DBR 26. In one specific example, each of the individual DBRs can consist of, for example, 8 pairs of alternating layers of zinc sulfide (ZnS) as a high index layer and calcium fluoride ($CaF_2$) as a low index layer and, with layer thicknesses of about 55.1 nm and 90.9 nm, respectively, for the first DBR 26 and second DBR 28. It is preferred that the thinner, low index layers be deposited first over the individual subpixels 18, 20, 22, as illustrated in FIG. 1. Forming the DBR 26 with the thinner layer (i.e., the high refractive index layer) directly on top of the subpixels 18, 20, 22 creates the refractive index contrast, or reflection, between the OLED and the DBR. If the thicker, low index layer were deposited directly on the OLED, the difference in the refractive index between the OLED materials and the low index layer would not be significant enough to create refractive index contrast, thus the lower index layer would act as an extension of the cavity length defined by OLED thickness. Depending on the DBR materials, the low index layer may be deposited directly on top of the microcavity device, but it is not preferred. Some examples of DBR materials include but are not limited to silicon nitride ($Si_3N_4$), silicon dioxide ($SiO_2$), zinc sulfide (ZnS), calcium fluoride ($CaF_2$), aluminum oxides ($AlO_x$), magnesium fluoride ($MgF_2$), lithium fluoride (LiF), tellurium oxides ($TeO_x$), and titanium dioxide ($TiO_2$). Because the structure of the first DBR 26 is different from the structure of the second DBR 28, the first DBR 26 and second DBR 28 will have different Bragg wavelengths and provide reflective properties to the subpixels in the microcavity array at different wavelengths ranges or reflective wavebands. The sum of the reflectance range of wavelengths, also referred to as the reflective waveband and reflectance stopband, of the first DBR 26 and second DBR 28 provides an overall wider reflectance range or reflectance stopband for the multi-DBR structure 44, enabling reflectance and emission across a wider stopband than what is possible with only one DBR structure. Optional intermediate layers can be deposited between the OLED device and the multi-DBR system, specifically between the top electrode and the first DBR. An intermediate layer can be used, for example, to adjust the cavity length between the two mirrors for the resonant wavelength/frequency. An optional capping layer may also be deposited on top of the multi-DBR system to adjust the phase shift as needed. The main function of an optional capping layer is to enhance the transmission of light (or light extraction) from the device. For example, without the capping layer, the light generated from OLED device travels from the DBR(s) to air. Alternatively, with the addition of a capping layer, the light generated from OLED device travels from the DBR(s) to capping layer then to air. Inserting this additional medium induces a phase shift between these two interfaces and enhances the light intensity. A resulting constructive interference can occur between the two interfaces, specifically the DBR/capping layer interface and the capping layer/air interface.

Figure 2:
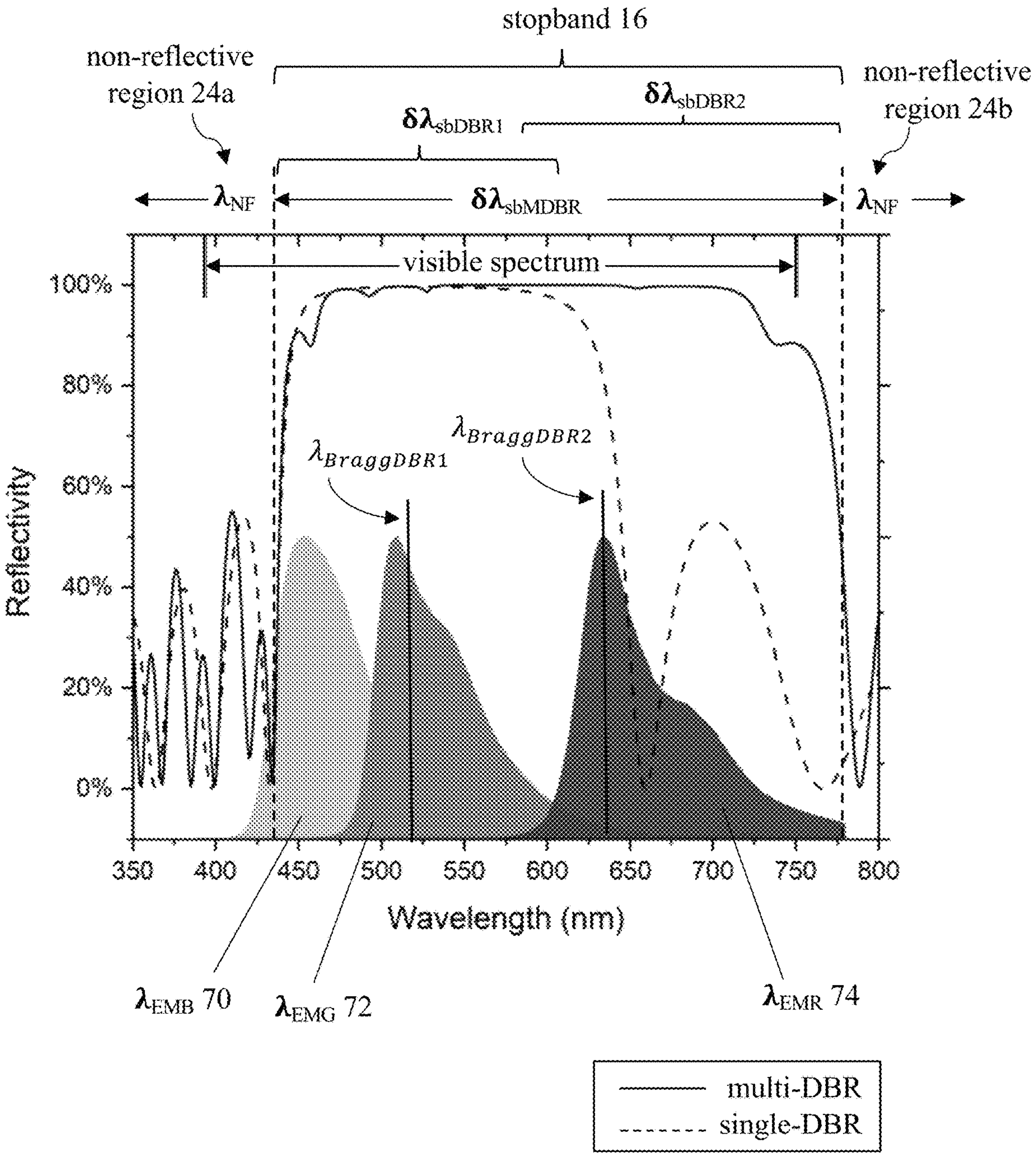
FIG. 2 is a reflectivity plot versus wavelength for a multi-color MCOLED array with a shared multiple DBR structure.

FIG. 2 is a reflectivity versus wavelength plot for a multi-color MCOLED array with a shared multiple DBR (multi-DBR) structure comprising red, green, and blue (RGB) pixels. The subpixel emission waveband, which is the pattern and range of wavelengths emitted by each colored subpixel is shown as blue emission waveband $\lambda_{EMB}$ 70, green emission waveband $\lambda_{EMG}$ 72, and red emission waveband $\lambda_{EMR}$ 74. The DBR operates as a mirror within the range of wavelengths of the device, known as the stopband. The reflectance plot of each of the single DBR and multi-DBR are shown, where the multi-DBR shown consists of the single DBR and a second DBR. Each of the two single DBRs, DBR1 and DBR2 that make up the multi-DBR structure whose plot is depicted has its own unique Bragg Wavelength, shown as $\lambda_{BraggDBR1}$ and $\lambda_{BraggDBR2}$, respectively. As previously described, a single DBR is designed considering the wavelength range or waveband of light to be reflected by the subpixels in the array and the optical path length of the cavity of the OLEDs or VSCELs in the array.

In a multiple DBR structure, the Bragg wavelength for the first DBR (single DBR), $\lambda_{BraggDBR1}$, value is used to calculate the stopband $\delta\lambda_{sbDBR1}$ range for the first DBR using:

$$\delta\lambda_{sb} = 2\frac{\lambda_{BraggDBR1}(n_{2DBR1} - n_{1DBR1})}{\pi n_{effDBR1}}$$

where:

$n_{1DBR1}$ is the refractive index of the low index layer of the first DBR at $\lambda_{BraggDBR1}$, and $n_{2DBR1}$ is the refractive index of the high index layer of the first DBR material at $\lambda_{BraggDBR1}$.

The value of the Bragg Wavelength for the second DBR $\lambda_{BraggDBR2}$, which in this case is situated above of the first DBR, is used to calculate the stopband range for the second DBR. In the depicted configuration with two DBRs stacked one top of one another and situated above the subpixels, as illustrated in FIG. 1, a stacked multi-DBR structure is created above each individual pixel, resulting in a total multi-DBR stopband width $\delta\lambda_{sb}$ 16 calculated using the lower value of the stopband range $\delta\lambda_{sbDBR1}$ for the first DBR and the upper value of the stopband range $\delta\lambda_{sbDBR2}$ for the second DBR. In this case, the total stopband 16 is between about 430 nm and 775 nm, which covers the entirety of the long wavelength region of the visible spectrum. Wavelengths within the stopband wavelength range, $\delta\lambda_{sb}$ 16, for the multi-DBR are emitted from the MCOLED, while wavelengths outside the stopband $\delta\lambda_{sb}$ 16 are in the non-reflective region, either at the short wavelength non-reflective region $\delta\lambda_{NF}$ 24*a* or in the long wavelength non-reflective region $\delta\lambda_{NF}$ 24*b*. By changing the structure of the two DBRs in the present example the Bragg wavelength of each of the structures can be further separated in the visible spectrum while retaining a suitable overlap region to cover more of the visible spectrum and stopband 16 of the multi-DBR structure, therefore widening the spectral bandwidth of the MCOLED array. The multiple distributed Bragg reflector (DBR) or multi-DBR structure having multiple single DBR structures creates a total spectral stopband 16 width that is wider than what can be achievable with a single DBR. Increasing the spectral stopband 16 to reflect a broader range of wavelengths range of light increases the overall spectral bandwidth for the MCOLED display. FIG. 1 illustrates an embodiment of the multi-DBR system wherein the first DBR has a Bragg wavelength that is less than the Bragg wavelength of the second DBR. In an alternative embodiment of the present disclosure, the first DBR in the multi-DBR system may have a Bragg wavelength that is higher than the Bragg wavelength of the second DBR. Overall, the multi-DBR system must be designed to achieve the required optical path length for the microcavity device.

Figure 3:
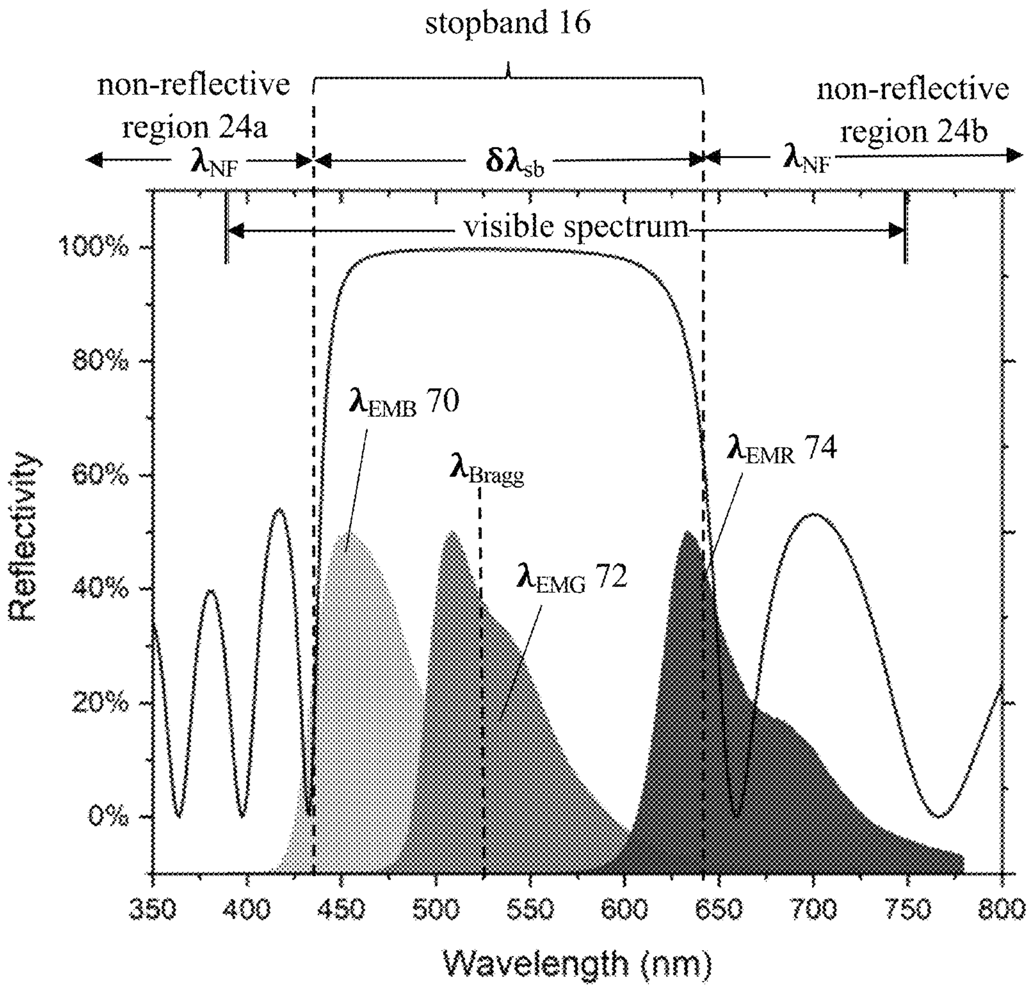
FIG. 3 is a reflectivity plot versus wavelength for a multi-color MCOLED array with a single shared DBR.

FIG. 3 is a reflectivity plot versus wavelength for a multi-color MCOLED array with a single shared DBR. The multi-colored microcavity OLED array has RGB subpixels with a single distributed Bragg reflector (DBR) on top of the MCOLEDs in the array. The total stopband $\delta\lambda_{sb}$ 16 reflectivity range for the single DBR as shown is from about 425 nm to about 650 nm, for a total stopband of 175 nm. The blue subpixel emission waveband, $\lambda_{EMB}$ 70, green subpixel emission waveband $\lambda_{EMG}$ 72, and red subpixel emission waveband $\lambda_{EMR}$ 74 are illustrated along the wavelength axis. It is noted that the wavelength axis is also used to illustrate non-reflective frequencies, $\lambda_{NF}$ 24*a*, 24*b* on both sides of the stopband $\delta\lambda_{sb}$ 16. Wavelengths in the non-reflective regions $\lambda_{NF}$ 24*a*, 24*b* are outside of the reflection stopband wavelength range of the single DBR and are not reflected by the DBR, and therefore not emitted by the MCOLED array.

The highest reflectivity (90% reflectance) of a DBR is attained when the OLED device layer thicknesses ($d_i$) are selected such that the optical path length of each layer is one quarter of the resonance wavelength, commonly referred to as the Bragg Wavelength, $\lambda_{Bragg}$. For perpendicular incidence, the layer thickness should be $d_i=\lambda_{Bragg}/4n_i$, where $n_i$ is the refractive index of the layer material. In the example shown in FIG. 3, a multicolored MCOLED array can have a first DBR consisting of 7 pairs of alternating layers of $CaF_2$ (low index of refraction, $n_1$=1.4338) and ZnS (high index of refraction material, $n_2$=2.35521), with material thicknesses of 90.9 nm and 55.1 nm, respectively, for the low index material and high index material. The Bragg wavelength, $\lambda_{Bragg}$ of the RGB microcavity OLEDs illustrated is 520 nm, which falls within the emission wavelength range for a green subpixel emission waveband $\lambda_{EMG}$ 72 (approx. 495-580 nm). The result is a broad-band high-reflectivity region, or stopband, $\delta\lambda_{sb}$ 16 centered on $\lambda_{Bragg}$ at about 525 nm. The reflection stopband $\delta\lambda_{sb}$ 16 is the wavelength range reflected by the DBR and is bound by the minimum and maximum wavelengths that achieve maximum reflectance in the DBR. Wavelength values outside of this range are transmitted through the DBR (i.e., not reflected) and are non-reflective frequencies in non-reflective regions $\lambda_{NF}$ 24*a*, 24*b*. Non-reflective regions $\lambda_{NF}$ 24*a*, 24*b* are outside of the reflection stopband wavelength range of the single DBR and are not reflected by the DBR, therefore the emission of $\lambda_{NF}$ 24 is not controlled by the MCOLED. A shared DBR device has a maximum achievable stop band $\delta\lambda_{sb}$ 16 region. It follows that the stop band $\delta\lambda_{sb}$ 16 restricts the MCOLED's emission wavelength range. For example, for a multi-colored MCOLED with a single DBR as shown, $\delta\lambda_{sp}$ 16 of 175 nm. Wavelength values below about 432.5 nm and exceeding about 607.5 nm are considered non-reflective frequencies in non-reflective regions $\lambda_{NF}$ 24*a*, 24*b* and are therefore unwanted emission that is not restricted or controlled by the MCOLED is omitted. This MCOLED design achieves effective wavelength coverage for blue and green subpixels in the blue subpixel emission waveband $\lambda_{EMB}$ 70 and green subpixel emission waveband $\lambda_{EMG}$ 72, respectively, however not for the red subpixel emission waveband $\lambda_{EMR}$ 74. The higher non-reflective frequencies, which is much of the red subpixel emission waveband $\lambda_{EMR}$ 74 therefore become stray emissions. The overall result of this single DBR design is that at the edges of the stopband as well as outside of the DBR stopband, certain wavelengths in the emission waveband of the pixel array, specifically in the red and blue regions, are poorly reflected by the DBR. The result is the incomplete reflection of wavelengths at the edges of the stopband. This results in uncontrolled emission in the visible spectrum at the edges and outside of the DBR waveband, thus reducing emitted color intensity in these regions.

Figure 4:
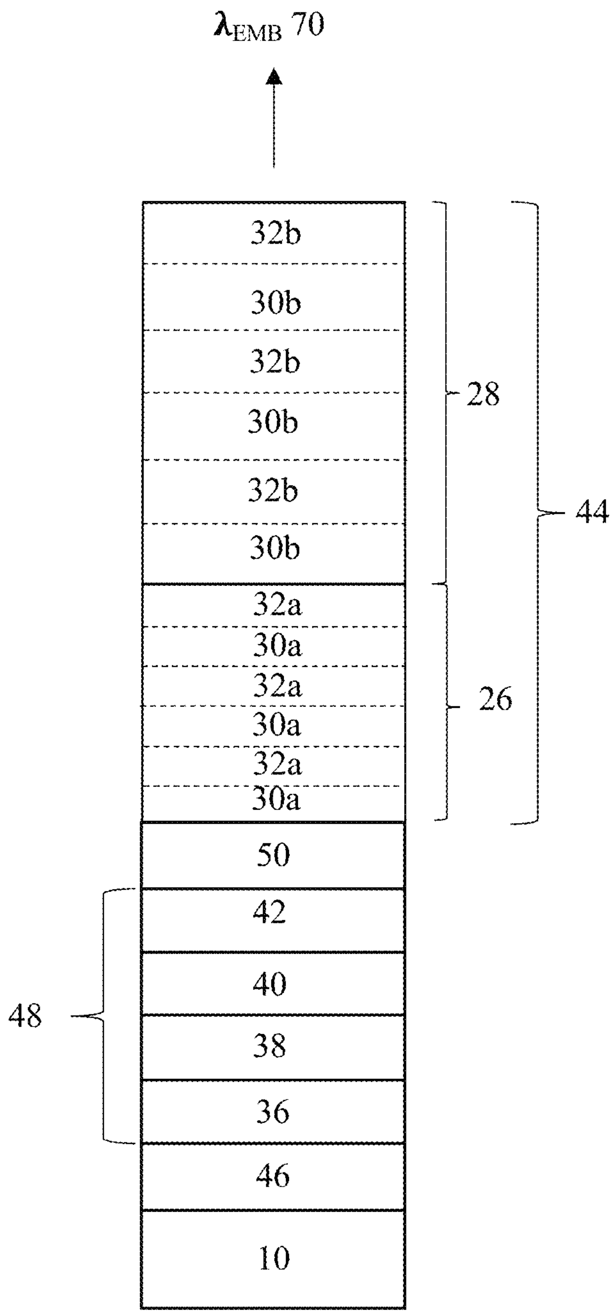
FIG. 4 illustrates a cross section of a single blue colored MCOLED array with a multi-DBR structure.

FIG. 4 illustrates a cross section of a single blue colored MCOLED array with a multi-DBR structure. In an MCOLED array, three individually colored subpixels (blue, green, and red) of are deposited on a substrate 10. For simplification, only the blue subpixel with blue emission waveband $\lambda_{EMB}$ 70 is shown to illustrate the layers of each individual pixel. In one example for a given single color subpixel, a bottom electrode 46 is deposited on a substrate 10, followed by an organic layer suitable for the particular OLED subpixel color, in this case for a blue subpixel. The layer thicknesses and materials are selected for the subpixel color desired. It is understood that each individual subpixel may comprise, but is not limited to, at least one first or bottom electrode layer 46, which can be an anode or cathode, and an organic stack 48 for the blue subpixel comprising one or more of an Organic Hole-Injection Layer (HIL), an Organic Hole-Transporting Layer (HTL), an Emissive Layer (EML), an Organic Electron-Transporting Layer (ETL), and an Organic Electron-Injection Layer (EIL), followed by a second or top electrode layer 50 which is the complementary anode or cathode to the bottom electrode layer 46. In the present example embodiment are shown electron transport layer 36, emission layers 38, hole transport layer 40, and hole injection layer 42. Consistent with FIG. 1, in a multi-DBR system, the subpixel also has a first DBR 26 and second DBR 28, which together made up a multi-DBR structure 44. The first single DBR 26 shown has 3 pairs of alternating layers of the $CaF_2$ (low index layer 30*a*) and ZnS (high index layer 32*a*), with layer thicknesses of 90.9 nm and 55.1 nm, respectively, however it is understood that this first DBR can have a range of number of pairs of low index layers 30*a* and high index layers 30*b*. Increasing the number of pairs in a DBR increases the mirror reflectivity, however the number of pairs (layers) must be balanced with the overall desired device dimensions as increasing the number of DBR layers also increases the device dimensions. The second DBR 28 also has a plurality of pairs of alternating layers of $CaF_2$ (low index layer 30*b*) and ZnS (high index layer 32*b*), with layer thicknesses of 110.1 nm and 66.7 nm, respectively. Some examples of alternative DBR materials include but are not limited to $Si_3N_4$, $SiO_2$, $AlO_x$, $MgF_2$, LiF. $TeO_x$, and $TiO_2$. Wavelengths within the stopband wavelength range, $\delta\lambda_{sbMBDR}$ 16, for the multi-DBR system 44 are emitted from the MCOLED.

Figure 5:
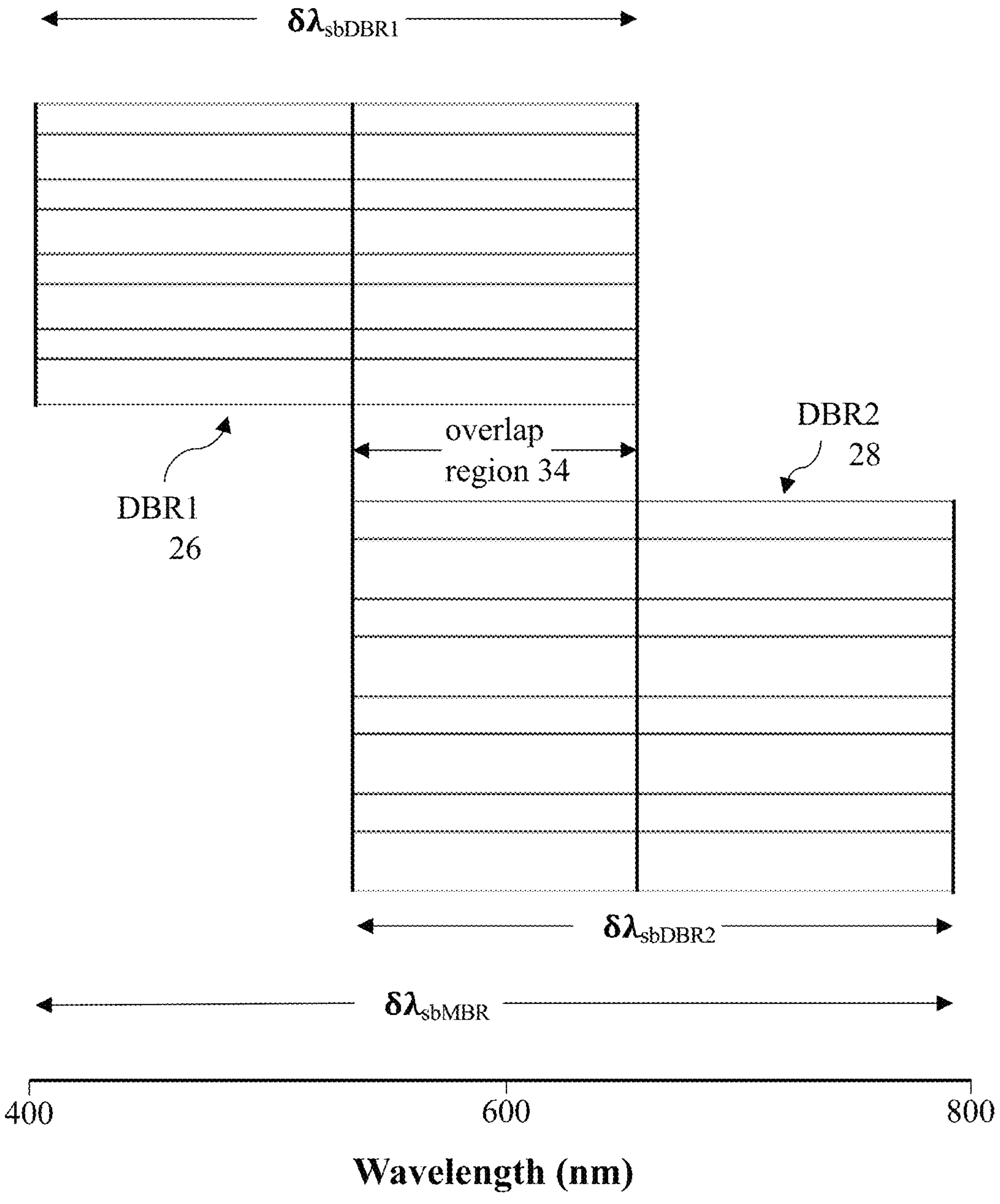
FIG. 5 illustrates a multi-DBR system with a first DBR and a second DBR with a stopband overlap region.

FIG. 5 illustrates a multi-DBR structure having two overlapping DBRs, with a first DBR 26, a second DBR 28, and a stopband overlap region 34, where the stopband overlap region 34 has a waveband of $\delta\lambda_{sbMDBR}$, which can be expressed as:

$$\delta\lambda_{sbMDBR} = \delta\lambda_{sbDBR1} + \delta\lambda_{sbDBR2} - \delta\lambda_{OR}$$

where:

$\delta\lambda_{sbDBR1}$ is the stopband waveband for the first DBR (DBR1), $\delta\lambda_{sbDBR1}$ is the stopband waveband for the second DBR (DBR2), and $\delta\lambda_{OR}$ is the waveband of the overlap region of DBR1 and DBR2.

The waveband $\delta\lambda_{OR}$ of the overlap region 34 encompasses the wavelengths of light included in the stopband ranges for both the first DBR and the second DBR. The total stopband width for the multi-DBR ($\delta\lambda_{sbMDBR}$) captures a greater range of desired wavelengths of the color spectrum for controlled emission. The total multi-DBR stopband width $\delta\lambda_{sb}$ is therefore calculated using the lower value of the stopband range $\delta\lambda_{sbDBR1}$ for the first DBR and the upper value of the stopband range $\delta\lambda_{sbDBR2}$ for the second DBR. It is noted that the above equations are ideal equations, independent of the period of the DBR(s) (dictated by the number of alternating pairs of low/high n material).

The presently described multi-DBR system has an increased stopband wavelength range of about 432.5 to about 728.5 nm for a total stopband 16 of with a $\delta\lambda_{sbMDBR}$ 16=296 nm to reflect and emit controlled light beams for all wavelengths of light emitted by individually colored subpixels blue 18, green 20, and red 22, thereby reducing the non-reflective wavelengths $\lambda_{NF}$. This is approximately a 69% increase in the wavelength range of the stopband compared to the single DBR system. Non-reflective frequencies $\lambda_{NF}$ lie outside of the reflection stopband wavelength range of the multi-DBR and are not reflected by the multi-DBR structure. The wavelength range captured by the embodiment of the DBR system illustrated is increased from 432.5 nm-607.5 nm for the single DBR to 432.5 nm-728.5 nm for the illustrated multi-DBR structure. It is noted that the number of pairs of each DBR can be any integer value and is limited here for illustrative purposes.

Fabrication

MCOLEDs used for high resolution light field display applications are nanometers in size, therefore face significant fabrication challenges, namely patterning. The term "patterning" refers to a technique using a series of post treatments to chemically engrave a transferred pattern into or allow the deposition of new material in the transferred pattern upon a target material. It is advantageous to deposit as many material layers as possible within the array using a deposition technique that requires no patterning at all, for example using blanket deposition, to avoid chemical etching and photolithography that can damaged pre-deposited layers. Alternative to depositing a single DBR per OLED, a shared DBR integrated into the array does not require patterning. Eliminating this patterning step in fabrication of a MCOLED array with strong cavity effects reduces manufacturing time, complexity and cost.

Figure 6A:
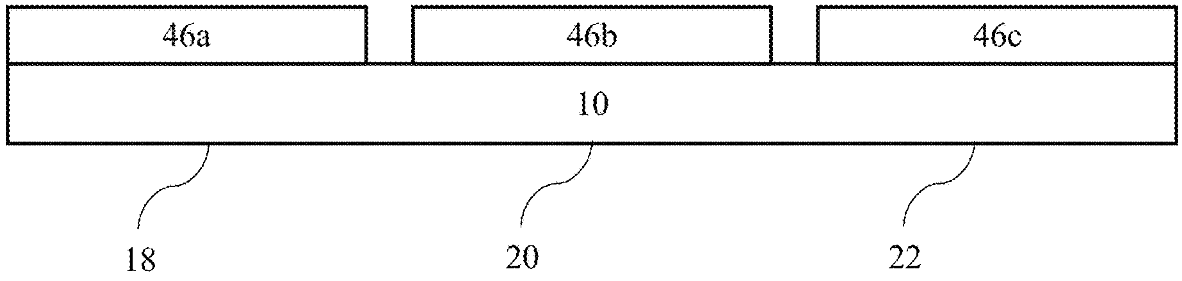
FIG. 6A illustrates a cross sectional view of a first step of a proposed MCOLED fabrication process for depositing the bottom first electrodes on a substrate.

FIGS. 6A-E illustrate a step-by-step process of fabricating a MCOLED array, as per the present disclosure. FIG. 6A illustrates a cross sectional view of a first step of one example MCOLED fabrication process for depositing the bottom first electrodes on a substrate. A bottom first series of bottom electrodes 46*a*, 46*b*, 46*c* is deposited on a single substrate 10, for each of the individually colored subpixels, blue 18, green 20, and red 22, respectively. The bottom electrodes 46*a*, 46*b*, 46*c* can be deposited by, for example, physical vapor deposition (PVD) such as thermal evaporation, electron-beam evaporation, sputtering, or by chemical vapor deposition (CVD) methods such as, for example, atomic layer deposition. The bottom electrodes 46*a*, 46*b*, 46*c* may be made of a reflective material, for example, a reflective metal such as silver (Ag), aluminum (Al), gold (Au), a combination thereof, or their alloys, as a single film layer or multi-layer film, for example Ag/Al, Li/Al, or Ca/Ag. In another embodiment of the present disclosure the bottom electrodes 46*a*, 46*b*, 46*c* can be, for example Indium Tin Oxide (ITO), Fluorine Doped Tin Oxide (FTO), Aluminum-doped Zinc Oxide (AZO), Indium-doped Zinc Oxide (IZO), Gallium-doped Zinc Oxide (ZnO), or a semitransparent thin metal film such as Ag. Al, Ag, Ca, Li, Au, or Ag: Mg alloy etc. In addition, a bottom reflective layer, or DBR, can further be deposited below the organic layers of the OLED to form the bottom reflective surface of the microcavity instead of or in addition to the bottom electrode 46*a*, 46*b*, 46*c*. The bottom electrodes 46*a*, 46*b*, 46*c* can also be single film or multi-layer film such as, for example, Ag/Al, Li/Al, and Ca/Ag.

Figure 6B:
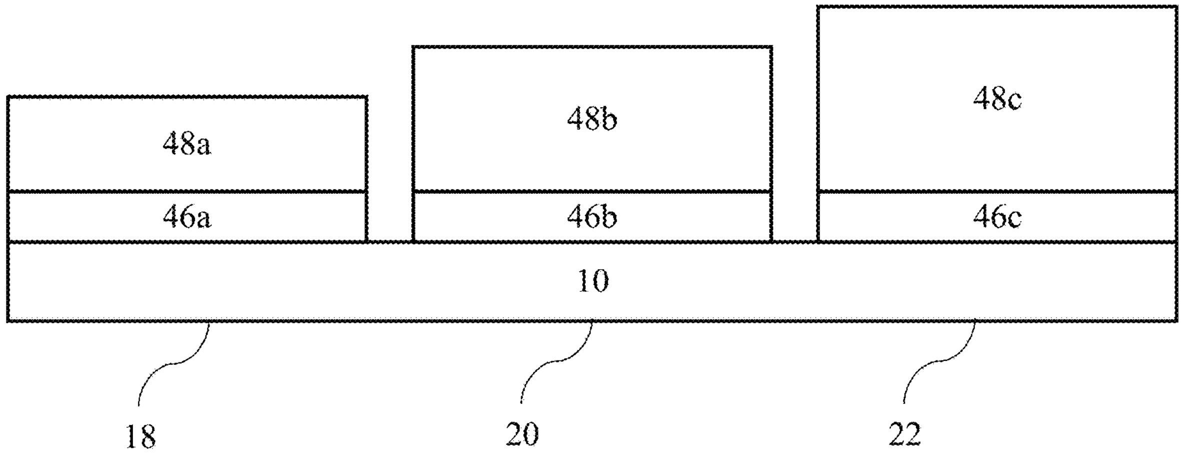
FIG. 6B illustrates a cross sectional view of a second step of the proposed MCOLED fabrication process for depositing organics stacks on each of the bottom first electrodes.

FIG. 6B illustrates a cross sectional view of a second of the proposed MCOLED process for depositing the organics stacks 48*a*, 48*b*, 48*c* on each of the bottom first electrodes 46*a*, 46*b*, 46*c* for each of the individually colored subpixels, blue 18, green 20, and red 22 on substrate 10. This embodiment illustrates an MCOLED array wherein each individually colored subpixel (blue 18, green 20, and red 22) has individual OLED stacks for each color, specifically a green OLED stack 48*a*, blue OLED stack 48*b*, and red OLED stack 48*c*, are deposited for each subpixel. The thickness of each OLED stack 48*a*, 48*b*, 48*c* determines the optical path length for that subpixel, thereby determining the color emitted by the subpixel. For example, the thickness of the red OLED stack 48*c* is larger than that of the green OLED stack 48*b*, resulting in a longer optical path length, as red required for red light emission (620-750 nm).

Figure 6C:
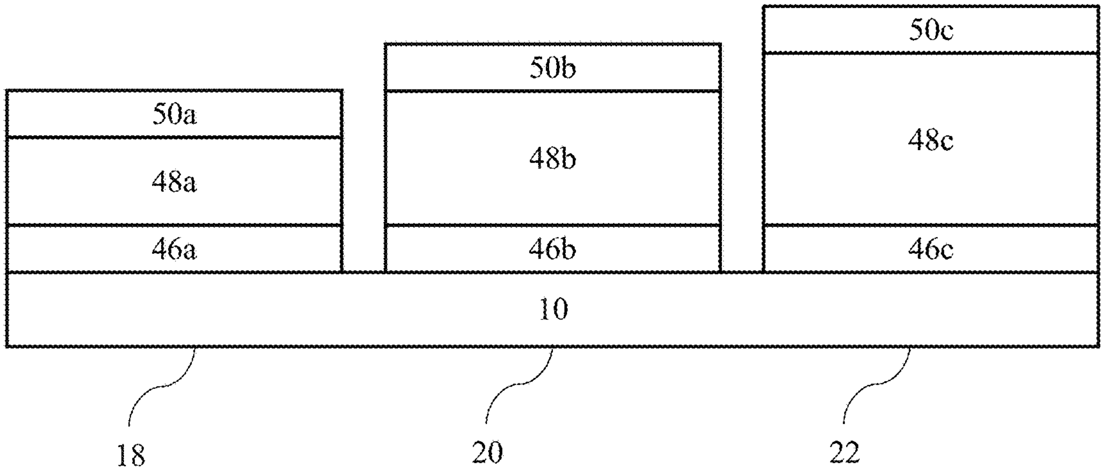
FIG. 6C illustrates a cross sectional view of a third step of the proposed MCOLED fabrication process for depositing top electrodes on each of the organic stacks.

FIG. 6C illustrates a cross sectional view of a third of the proposed MCOLED process for depositing top electrodes 50*a*, 50*b*, 50*c* on each of the organic stacks. The electrodes can be deposited individually on each of organics stacks 48*a*, 48*b*, 48*c*, optionally with patterning. It is understood that each individually colored subpixel 18, 20, 22 on substrate 10 can also share a top electrode, deposited using a blanket deposition technique. Similar to the bottom electrodes 46*a*, 46*b*, 46*c*, the top electrodes 50*a*, 50*b*, 50*c* may be made of transparent conductive oxide such as, for example Indium Tin Oxide (ITO), Fluorine Doped Tin Oxide (FTO), Aluminum-doped Zinc Oxide (AZO), Indium-doped Zinc Oxide (IZO), Gallium-doped Zinc Oxide (ZnO), or a semitransparent thin metal film such as Ag, Al, Ag. Ca, Li, Au and Ag: Mg alloy etc. They can also be single film or multi-layer film such as, for example, Ag/Al, Li/Al, and Ca/Ag. The top electrode can be a cathode and the bottom electrode an anode, or visa versa.

Figure 6D:
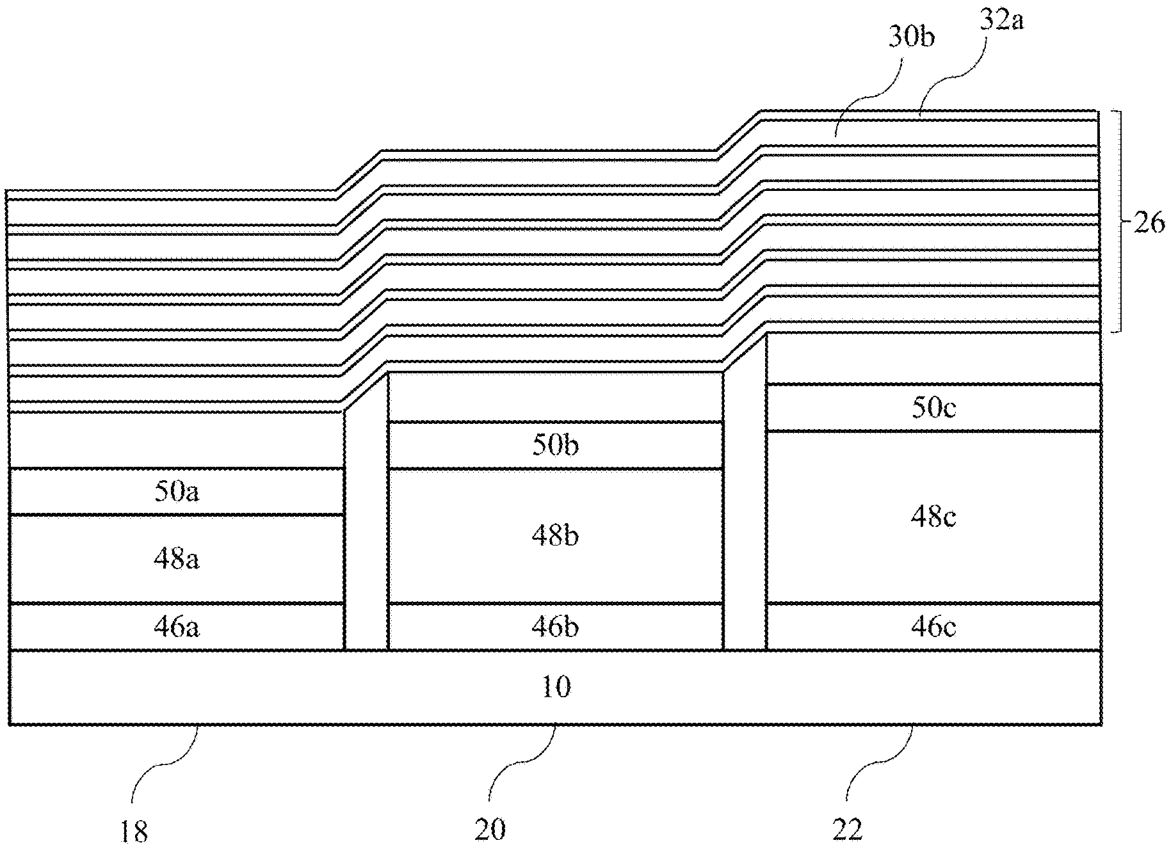
FIG. 6D illustrates a cross sectional view of step 4 of the proposed MCOLED fabrication process for depositing a first DBR over the top electrodes using a blanket deposition technique.

FIG. 6D illustrates a cross sectional view of a fourth step of the proposed MCOLED fabrication process for depositing a first DBR 26 over the top electrodes 50*a*, 50*b*, 50*c* using a blanket deposition technique. The DBR 26 acts as a mirror and forms an optical microcavity between each bottom electrode 46*a*, 46*b*, 46*c* and the DBR 26 above top electrodes 50*a*, 50*b*, 50*c*, for each subpixel 18, 20, 22 comprising organics stacks 48*a*, 48*b*, 48*c* supported by substrate 10. The first DBR 26 is comprised of alternating high refractive index dielectric layers 30*a* and low refractive index dielectric layers 32*a*. The number of layers of high and low refractive index dielectric layers can be any integer of layers, with seven pairs comprising fourteen layers shown in this configuration.

Figure 7:
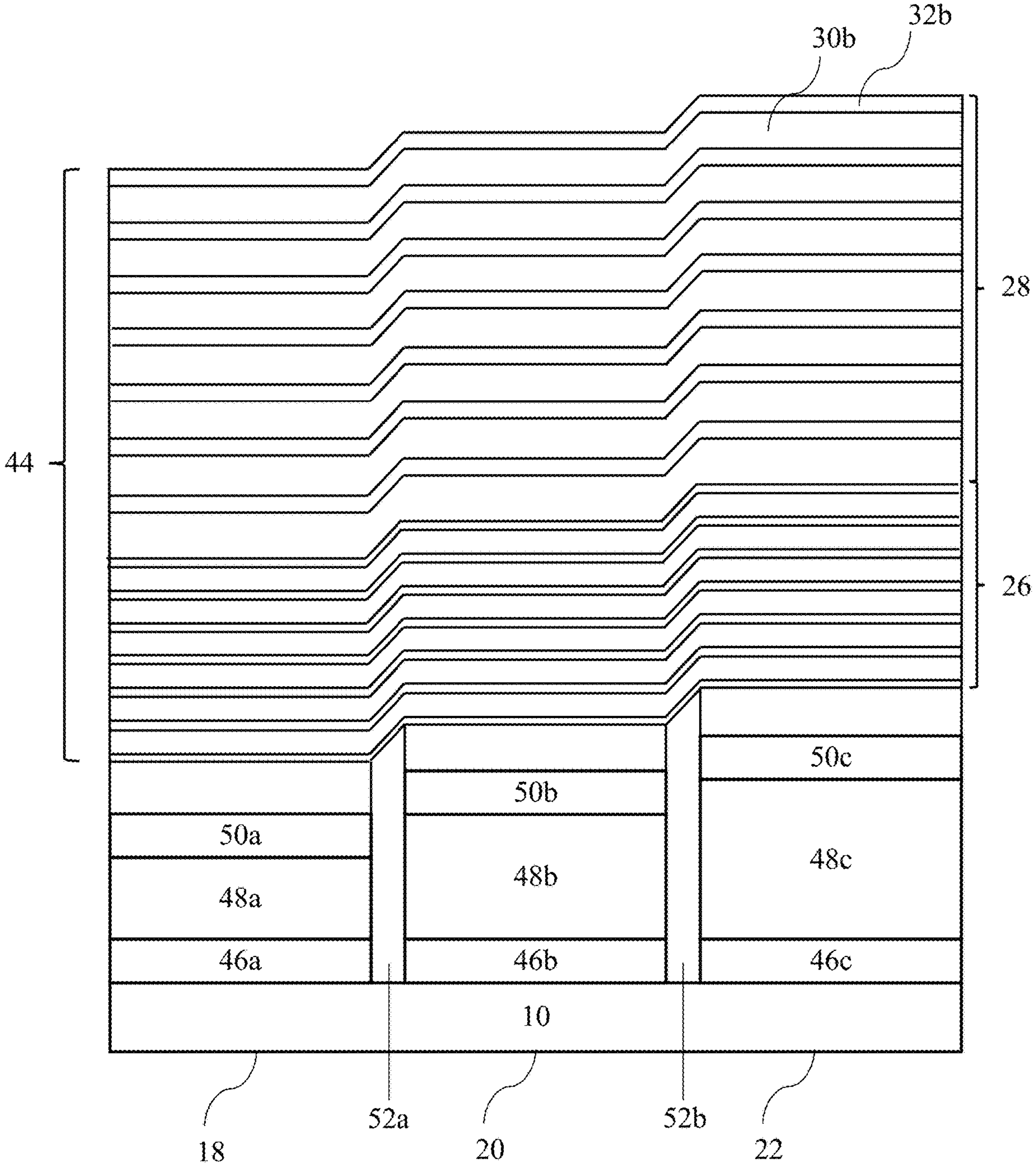
FIG. 7 illustrates a cross sectional view of a final step for depositing a second DBR over the top surface of the first DBR using a blanket deposition technique, to form a multi-DBR system.

FIG. 7 illustrates a cross sectional view of a fifth step of the proposed MCOLED fabrication process for depositing a second DBR 28 over the top surface of the first DBR 26 using a blanket deposition technique, to form a multi-DBR system 44. The multi-DBR system 44 is deposited above the organics stacks 48*a*, 48*b*, 48*c* and top electrodes 50*a*, 50*b*, 50*c*, for each subpixel 18, 20, 22 The second DBR 28 is comprised of alternating high refractive index dielectric layers 30*b* and low refractive index dielectric layers 32*b*. The number of layers of high and low refractive index dielectric layers can be any integer of layers, with seven pairs comprising fourteen layers shown in this configuration. In this embodiment the thickness of the first DBR 26 is neglected in the calculation of the optical length of the microcavity and the top second DBR 28 acts as the first reflective surface for the optical microcavity of each OLED device in the OLED array. An optional pixel definition layer (PDL) 52*a*, 52*b* is deposited on bottom electrodes 46*a*, 46*b*, 46*c* and substrate 10 between the subpixels. The pixel definition layer (PDL) 52*a*, 52*b* may be composed of an inorganic material such as an insulting dielectric, for example $Si_3N_4$, $AlO_x$, $TiO_2$ or $SiO_2$, or an organic material such as, for example, a photosensitive polyimide. The PDL 52 can be deposited by, for example, physical vapor deposition (PVD) such as thermal evaporation, electron-beam evaporation, sputtering, or by chemical vapor deposition (CVD) methods such as atomic layer deposition. If no PDL is deposited the same subpixel array structure can be created with a gap between subpixels. It has been found that use of a PDL between subpixels can prevent inter-pixelate electrical crosstalk by using insulating materials.

Figure 8:
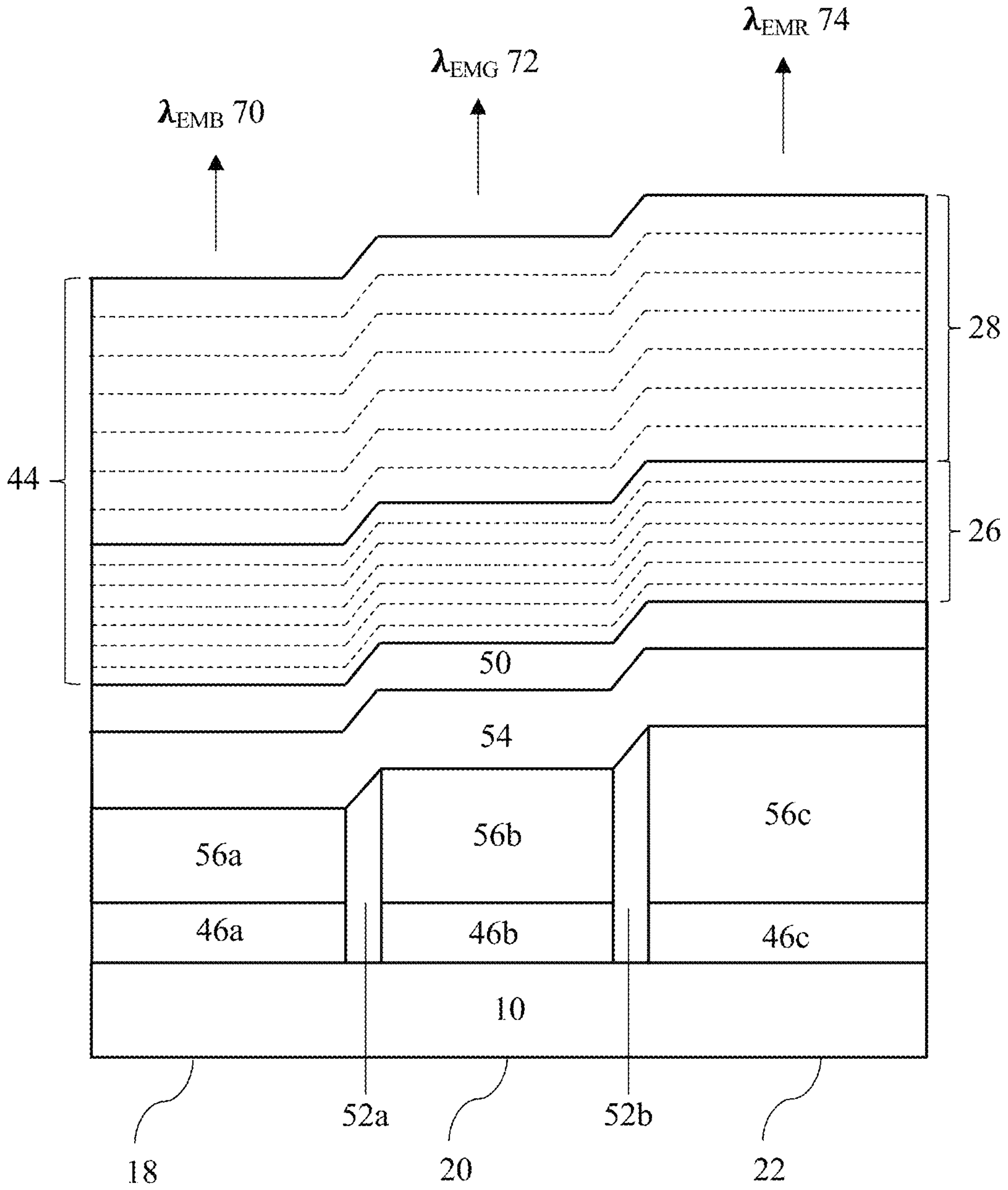
FIG. 8 illustrates a cross sectional view of an alternative embodiment of the disclosed MCOLED array having a white organic stack.

FIG. 8 illustrates a cross section of a MCOLED array device in an embodiment of the present disclosure having a white organic stack 54 replacing the blue, green, and red colored organics stacks to create a plurality of subpixels. The white organic stack 54 is deposited using blanket deposition over a series of optical filler layers 56*a*, 56*b*, 56*c* on top of the series of bottom electrodes 46*a*, 46*b*, 46*c* on substrate 10. The optical path length of each subpixel in the MCOLED can be adjusted by changing the thickness of one or more of the materials between the reflective surfaces, above the OLED, by adding one or more optical filler layers 56*a*, 56*b*, 56*c* and adjusting the thickness of the optical filler layer for the desired color, for example as blue emission waveband $\lambda_{EMB}$ 70, green emission waveband $\lambda_{EMG}$ 72, and red emission waveband $\lambda_{EMR}$ 74. An optional pixel definition layer (PDL) 52*a*, 52*b* is deposited on bottom electrodes 46*a*, 46*b*, 46*c* and substrate 10 between the subpixels. A white organic stack 54 containing a white emission layer may be blanket deposited as it is capable of emitting all three R, G, B primary colors. With each optical microcavity, only the desired color would exit the corresponding pixel as the optical microcavity filters out other colors. The white organic 54 stack comprises a series of organic layers beneath the emission layer, which could include a hole injection layer (HIL), a hole transport layer (HTL), an electron injection layer (EIL), an electron transport layer (ETL) and an emissive layer (EML), depending on the configuration of the MCOLED, and can be in an inverted MCOLED or a conventional MCOLED configuration. In the embodiment shown, the top electrode 50 can be deposited using a blanket deposition technique over the white organic stack 54 and is common to all MCOLED structures. In this embodiment, the reflective surface comprises a first DBR 26 and a second DBR 28 deposited on top of the first DBR 26. Together the first DBR 26 and the second DBR 28 make up the multi-DBR structure 44. Optical filler layers 56*a*, 56*b*, 56*c* are designed to be of a particular material and width in order to create the desired optical pathlength for a blue subpixel 18, green subpixel 20, and red subpixel 22. Suitable filler layer materials include but are not limited to transparent oxides such as indium tin oxide (ITO) and indium-doped zinc oxide (IZO). It is noted that the optical filler layers 56*a*, 56*b*, 56*c* may be formed of the same material or different materials.

Figure 9:
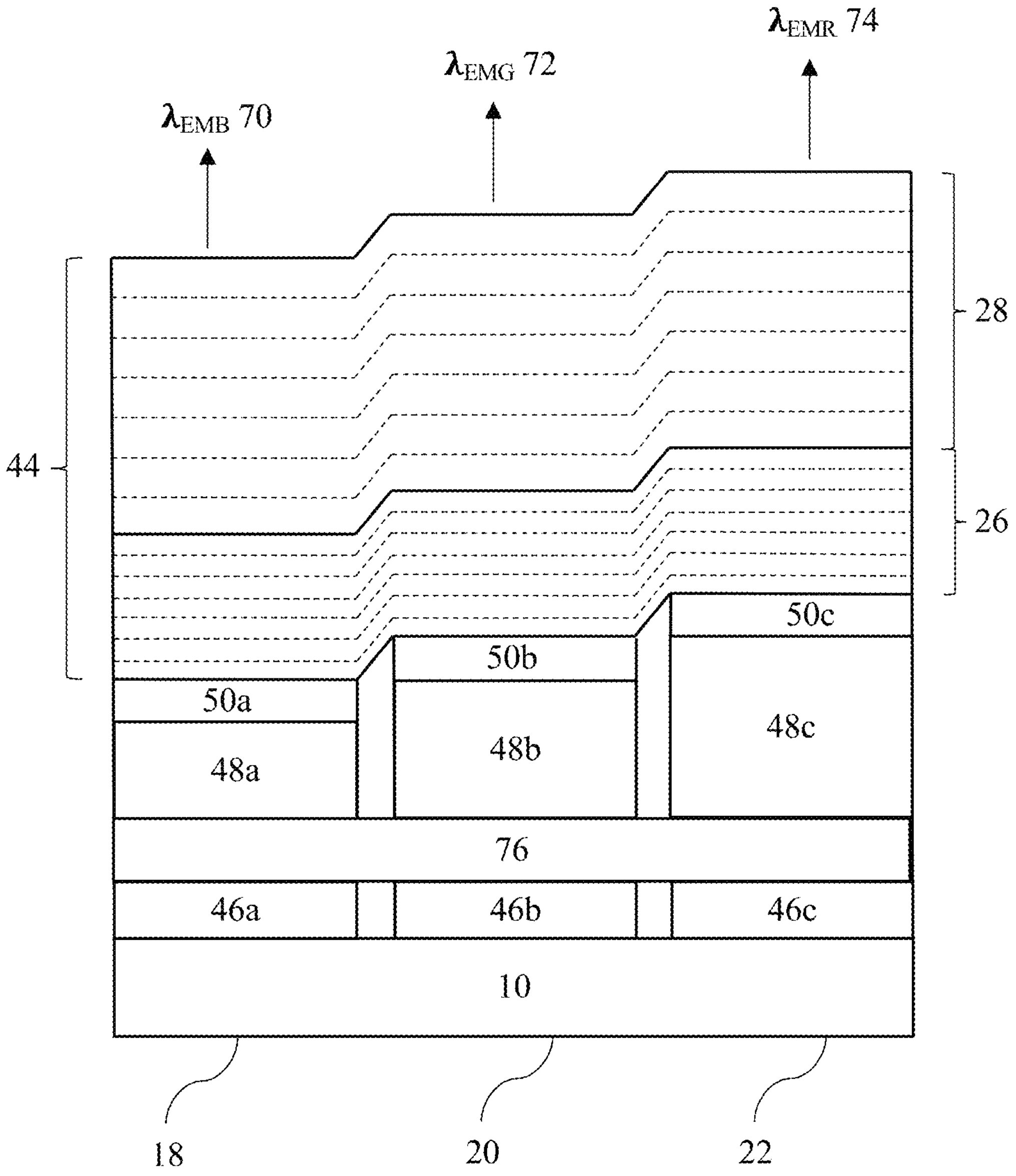
FIG. 9 illustrates a cross sectional view of an alternative embodiment of the disclosed MCOLED array having a bottom DBR.

FIG. 9 illustrates a cross sectional view of an alternative embodiment of the disclosed MCOLED array having a bottom shared DBR 76. The multi-color MCOLED array has a blue subpixel 18, green subpixel 20, and red subpixel 22, which emit a blue emission waveband $\lambda_{EMB}$ 70, green emission waveband $\lambda_{EMG}$ 72, and red emission waveband $\lambda_{EMR}$ 74, respectively. Each of the three individually colored subpixels (blue 18, green 20, and red 22) of the multi-colored OLED array are deposited on top of an individual bottom electrode 46$a$, 46$b$, 46$c$. A bottom shared DBR 76 is deposited on top of the bottom electrodes 46$a$, 46$b$, 46$c$, and each colored subpixel is deposited on top of the bottom DBR 76. It is understood that each individual pixel 18, 20, 22 may comprise an organic semiconductor layer 48$a$, 48$b$, 48$c$ specific to the color of the subpixel, and a top electrode 50$a$, 50$b$, 50$c$ which serves as a second electrode and the complementary anode or cathode to the bottom electrode. Additionally, the organic semiconductor layer may also be replaced by a combination of a general white OLED stack and optical fillers layers to achieve the desired color for each subpixel as described herein. The organic semiconducting layer can comprise one or more of an Organic Hole-Injection Layer (HIL), an Organic Hole-Transporting Layer (HTL), an Emissive Layer (EML), an Organic Electron-Transporting Layer (ETL), and an Organic Electron-Injection Layer as needed for generation of the photons emitted from the pixel. Individual subpixels 18, 20, 22 share a single first DBR 26 with alternating layers material having a low index of refraction, or low index layer, and high index of refraction, or high index layer. On top of the first DBR 26 is a second DBR 28, also comprises of layers of alternating high index layers and low index layers, however having a different layer thickness, or alternatively a different layer structure and/or composition, as the layers in the first DBR 26. The combination of the first DBR 26 and a second DBR 28 is the multi-DBR 44 which provides the expanded stopband for the multi-colored pixel array.

Optical resonance is achieved within a microcavity device when wavelengths of light, reflected between two mirrors, achieve the same phase. This condition is known as constructive interference wherein wavelengths of the same phase combine, resulting in a more intense light beam. Wavelengths of light that are out of phase, do not constructively interfere, and are phased out (i.e., the intensity is significantly reduced until it is negligible). This light reflection occurs within the microcavity of the device. In this case, the microcavity of an OLED. By intensifying only resonant frequencies, the emission spectrum of light is thereby narrowed/reduced. In other words, light emitted by the DBR has a narrower wavelength range compared to a device without a DBR structure.

With stronger microcavity effects, the emission of a microcavity device can be narrowed to approach that of a laser. For DBR design, the resonant wavelength is the desired, most intense wavelength to be output by the device. To achieve this, the resonant wavelength is referred to as the Bragg wavelength, and the thickness of each material layer in the alternating material pairs in each of the distributed Bragg reflectors (DBRs) is chosen such that thickness is equal to the Bragg wavelength divided by 4 times the index of refraction for that material, n.

As illustrated in FIG. 3, the spectrum of light emitted by a DBR device (stopband 16) encompasses a range of wavelengths. As the intensity of the microcavity increases (i.e., by increasing the number of alternating material layers) the stopband 16 is reduced. For RGB subpixels sharing a single DBR, there is a tradeoff between achieving maximum intensity of the stopband 16 and capturing the color spectrum for blue, green, and red light. Addition of an additional DBR structure over a first DBR structure increases the color spectrum of the stopband 16 for an RGB subpixel, without sacrificing the intensity of the output light. A single DBR device can only achieve a certain contrast between its high and low index material layers. The introduction of a second DBR device deposited on top of the first DBR device, creates an additional refractive index contrast boundary between the last layer of the first DBR and the first layer of the second DBR. In one embodiment, the low index material layers and the high index material layers of the first and second DBR are the same material. In another embodiment, the low index material layers and the high index material layers of the first and second DBR are different materials. A higher index contrast results in higher reflectivity of the DBR device. As illustrated in FIG. 7, the first DBR is designed for a lower Bragg wavelength and the second DBR is designed for a higher Bragg wavelength, both DBR devices having high reflectivity, such that there are two resonance conditions, increasing the stopband of the device without sacrificing the intensity (color) of the output light.

All publications, patents and patent applications mentioned in this specification are indicative of the level of skill of those skilled in the art to which this invention pertains and are herein incorporated by reference. The reference to any prior art in this specification is not, and should not be taken as, an acknowledgement or any form of suggestion that such prior art forms part of the common general knowledge.

The invention being thus described, it will be obvious that the same may be varied in many ways. Such variations are not to be regarded as a departure from the scope of the invention, and all such modifications as would be obvious to one skilled in the art are intended to be included within the scope of the following claims.

The invention claimed is:

1. A microcavity Organic Light Emitting Diode (MCOLED) array device comprising:
- a substrate;
- a plurality of subpixels deposited above the substrate, the subpixels having at least three different colors, each subpixel comprising:
  - a bottom electrode;
  - an optical filler layer deposited above the bottom electrode, the optical filler layer having a thickness selected for a specific color emission;
  - a white organic stack deposited above the optical filler layer; and
  - a top electrode deposited above the white organic stack; and
- a shared multi-DBR system deposited above the plurality of subpixels as a blanket structure extending continuously across the plurality of subpixels having the at least three different colors, the shared multi-DBR system comprising:
  - a first distributed Bragg reflector (DBR) having a first Bragg wavelength and a first stopband; and
  - a second distributed Bragg reflector (DBR) deposited above the first DBR, the second DBR having a second Bragg wavelength different from the first Bragg wavelength and a second stopband, wherein the first stopband and the second stopband overlap to form a multi-DBR stopband encompassing emission wavelengths of the at least three different colors.

2. The device of claim 1, wherein the first DBR and the second DBR are comprised layers of one or more of silicon nitride ($Si_3N_4$), silicon dioxide ($SiO_2$), zinc sulfide (ZnS), calcium fluoride ($CaF_2$), aluminum oxides ($AlO_x$), magnesium fluoride ($MgF_2$), lithium fluoride (LiF), tellurium oxides ($TeO_x$), and titanium dioxide ($TiO_2$).

3. The device of claim 1, wherein the first DBR and the second DBR comprise sublayers of alternating high refractive index dielectric material and low refractive index dielectric material, and each sublayer provides an optical path length equal to one quarter of the Bragg wavelength for the DBR.

4. The device of claim 3, wherein the sublayers of alternating high refractive index dielectric material and low refractive index dielectric material have different indices of refraction.

5. The device of claim 3, wherein the sublayers of alternating high refractive index dielectric material and low refractive index dielectric material the first DBR and the second DBR are of one or more different thicknesses.

6. The device of claim 1, wherein the bottom electrode of each subpixel comprises a reflective metal or reflective metal alloy.

7. The device of claim 1, wherein the bottom electrode comprises one or more layers of silver (Ag), aluminum (Al), gold (Au), Ag/Al, Lithium (Li)/Al, or Calcium (Ca)/Ag.

8. The device of claim 1, wherein the top electrode comprises one or more of a metal reflective surface and a semi-transparent conductive material.

9. The device of claim 1, wherein the white organic stack is capable of emitting red, green, and blue primary colors.

10. The device of claim 1, wherein the optical filler layer for each subpixel creates a desired optical path length for the specific color emission.

11. The device of claim 1, wherein the optical filler layer for different colored subpixels comprise one or more of different thicknesses and different materials.

12. The device of claim 1, wherein the optical filler layer comprises transparent oxides.

13. The device of claim 12, wherein the transparent oxides comprise one or more of indium tin oxide (ITO) and indium-doped zinc oxide (IZO).

14. The device of claim 1, wherein the top electrode is deposited using blanket deposition and is common to all subpixels.

15. The device of claim 1, further comprising pixel definition layers deposited between the subpixels.

16. The device of claim 1, wherein the white organic stack comprises one or more of a hole injection layer, a hole transport layer, an electron injection layer, an electron transport layer, and an emissive layer.

17. The device of claim 1, wherein each subpixel forms an optical microcavity that filters light to emit only the desired color for that subpixel.

* * * * *